United States Patent [19]

Hayabuchi

[11] Patent Number: 5,324,675
[45] Date of Patent: Jun. 28, 1994

[54] METHOD OF PRODUCING SEMICONDUCTOR DEVICES OF A MONOS TYPE

[75] Inventor: Itsunari Hayabuchi, Chiba, Japan

[73] Assignee: Kawasaki Steel Corporation, Hyogo, Japan

[21] Appl. No.: 40,341

[22] Filed: Mar. 30, 1993

[30] Foreign Application Priority Data

Mar. 31, 1992 [JP] Japan .................................. 4-77673

[51] Int. Cl.$^5$ ............................................ H01L 21/31
[52] U.S. Cl. .................................. 437/42; 437/920; 437/978
[58] Field of Search ............... 437/42, 43, 238, 920, 437/978; 148/DIG. 43, DIG. 112, DIG. 114, DIG. 156

[56] References Cited

U.S. PATENT DOCUMENTS

| | | | |
|---|---|---|---|
| 4,264,376 | 4/1981 | Yatsuda et al. | 437/42 |
| 4,466,172 | 8/1984 | Batra | 437/42 |
| 5,094,966 | 3/1992 | Yamazaki | 437/42 |

FOREIGN PATENT DOCUMENTS 62-60231  3/1987  Japan ................................ 437/920

Primary Examiner—Brian E. Hearn
Assistant Examiner—Chandra Chaudhari
Attorney, Agent, or Firm—Oliff & Berridge

[57] ABSTRACT

A method of producing a semiconductor device of the type which includes a semiconductor substrate; a gate insulating layer of a triplex structure formed on the semiconductor substrate and composed of a first oxide layer, an oxidation-resistant layer and a second oxide layer, and a gate electrode formed on the gate insulating layer, includes the steps of: forming the first oxide layer, the oxidation-resistant layer, and the second oxide layer successively on the semiconductor substrate; adjusting the thickness of the oxidation-resistant layer during or after the formation thereof in such a way that the entire oxidation-resistant layer can be oxidized in a post-process in which the oxidation-resistant layer is oxidized except for that region which corresponds to the gate electrode; and oxidizing the oxidation-resistant layer except for the region corresponding to the gate electrode and forming an oxide layer around the gate electrode, whereby the oxidation-resistant layer is entirely oxidized except for the region corresponding to the gate electrode. The resulting silicon oxide layer can be used as an address gate or as the gate insulating layer of an MOS transistor gate for a peripheral circuit.

4 Claims, 6 Drawing Sheets

METHOD OF PRODUCING SEMICONDUCTOR DEVICES OF A MONOS TYPE

BACKGROUND OF THE INVENTION

1. Field of the Invention

This invention relates to a method of producing semiconductor devices and, in particular, to a method of producing semiconductor devices of a MONOS (metal oxide nitride oxide semiconductor) type.

2. Description of the Related Art

As a semiconductor nonvolatile-storage device capable of realizing a reduction in program voltage, a MONOS-type semiconductor nonvolatile storage device has been used, which includes: a semiconductor substrate; a gate insulating layer formed in a channel area on the semiconductor substrate and composed of a lower silicon oxide layer (a tunnel oxide layer), a silicon nitride layer, and an upper silicon oxide layer (a top oxide layer), which are arranged in that order from the side of the semiconductor substrate; and a gate electrode provided on the gate insulating layer.

This semiconductor storage device has usually been produced by the following method, which is illustrated in FIGS. 8 through 12:

First, the surface of a silicon semiconductor substrate 1, which has been separated into device regions by a selectively formed oxide layer 2, is subjected to thermal oxidation to form a lower silicon oxide layer 3 which is as thin as approximately 20Å. Then, a silicon nitride layer 4 having a thickness of 20Å to 150Å is formed on the lower silicon oxide layer 3 by CVD (chemical vapor deposition). Further, a top oxide layer 5 having a thickness of approximately 40Å is formed on the silicon nitride layer 4 by thermal oxidation or CVD.

When forming the top oxide layer 5 of the silicon nitride layer 4 by thermal oxidation, steam oxidation is performed at a temperature of 900° to 950° C. In that process, the silicon nitride layer 4 becomes thinner, being consumed to a thickness corresponding to 1/1.6 of the grown oxide layer. In this way, a gate insulating layer 7 having a triplex structure is formed.

Next, a polycrystalline silicon layer 6 is formed by CVD on this gate insulating layer, as shown in FIG. 8.

Subsequently, a resist 8 is applied to the polycrystalline silicon layer 6 and is exposed and developed to effect patterning. After that, the polycrystalline silicon layer 6 is selectively removed to form a gate electrode 9 consisting of a part of the polycrystalline silicon layer 6 on the substrate 1 through the intermediation of the gate insulating layer 7, as shown in FIG. 9.

Then, the gate insulating layer 7 is selectively removed so as to leave only that portion thereof which is under the gate electrode 9, thereby partly exposing the semiconductor substrate 1, as shown in FIG. 10.

Next, the resist layer 8 is removed and, as shown in FIG. 11, a silicon oxide layer 10 is formed by oxidation on the gate electrode 9 and on the exposed portion of the semiconductor substrate 1. This silicon oxide layer 10 is utilized as an inter-layer insulating layer surrounding the gate electrode 9 and as the address gate of the semiconductor substrate 1 or the gate insulating layer of a peripheral circuit.

Further processes, such as the formation of an address electrode, are performed. In this way, a semiconductor nonvolatile storage device is completed.

In the conventional production method described above, etching is performed when the procedure advances from the condition shown in FIG. 9 to that shown in FIG. 10. That is, when selectively removing the gate insulating layer 7 in such a way as to leave only that portion thereof which is under the gate electrode 9, the etching is performed until the semiconductor substrate 1 is exposed.

However, terminal control in the etching of the gate insulating layer 7 to expose the semiconductor substrate 1 is very difficult, normally resulting in overetching.

Thus, the exposed surface of the semiconductor substrate 1 is rather rough, which leads to impaired induction, etc. Further, the above etching leads to a phenomenon generally called "overhang" in which the gate insulating layer 7 is partially cut, as indicated at 11 in ιG. 12.

These problems cause a deterioration in gate withstand voltage and a dispersion in initial memory characteristics, adversely affecting the memory properties. Further, the problems lead to a deterioration in the write/erase and data retention properties of the storage device, generation of an interfacial level, etc., thereby decreasing the reliability of the semiconductor storage device.

SUMMARY OF THE INVENTION

This invention has been made with a view toward solving the above problems. It is an object of this invention to provide a method of producing semiconductor devices which can avoid overetching of the semiconductor substrate and overhang of the gate insulating layer, and thereby provides excellent memory characteristics and high reliability.

In accordance with this invention, there is provided a method of producing a semiconductor device of the type which includes a semiconductor substrate; a gate insulating layer of a triplex structure formed on the semiconductor substrate and composed of a first oxide layer, an oxidation-resistant layer and a second oxide layer; and a gate electrode formed on the gate insulating layer, the method comprising the steps of:

forming the first oxide layer, the oxidation-resistant layer, and the second oxide layer successively on the semiconductor substrate;

adjusting the thickness of the oxidation-resistant layer during or after the formation thereof in such a way that the entire oxidation-resistant layer can be oxidized in a post-process in which the oxidation-resistant layer is to be oxidized except for that region which corresponds to the gate electrode; and oxidizing the oxidation-resistant layer except for that region corresponding to the gate electrode and forming an oxide layer around the gate electrode.

Thus, with this method, the entire oxidation-resistant layer is oxidized except for that region which corresponds to the gate electrode.

Accordingly, except for the region around the first gate electrode, there is formed a silicon oxide layer which is composed of the first oxide layer, the silicon oxide layer obtained by oxidizing the oxidation-resistant layer, and the second silicon oxide layer. This silicon oxide layer can be used as an address gate or as the gate insulating layer of an MOS transistor gate for a peripheral circuit.

With the method of this invention, the conventional process of performing etching until a part of the semiconductor substrate is exposed can be eliminated, thereby making it possible to avoid overetching the semiconductor substrate, overhang of the gate insulating layer, etc.

DESCRIPTION OF PREFERRED EMBODIMENTS

Figure 1:
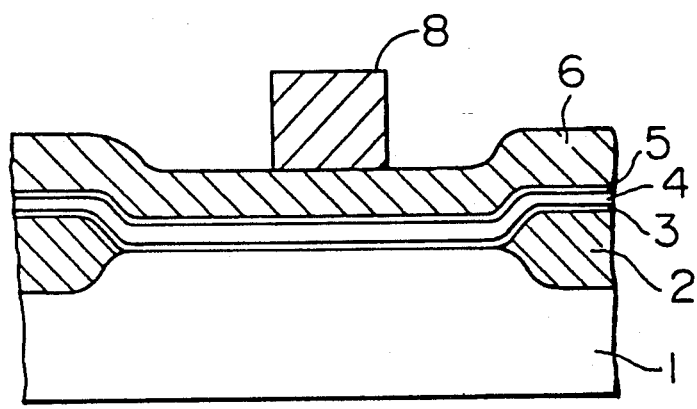
FIG. 1 is a schematic sectional view showing a part of a semiconductor device-producing process according to first and second embodiments of this invention.

Embodiments of the present invention will be described with reference to the drawings.

First, an embodiment of the present invention as claimed in claim 1 will be described.

The surface of a silicon semiconductor substrate 1 is separated into regions by a selectively formed silicon oxide film 2. Then, the surface of the silicon semiconductor substrate 1 is subjected to thermal oxidation to form a first oxide layer 3 having a thickness of approximately 20Å.

Next, a silicon nitride layer 4, which consists of a non-oxidizable substance, is formed by CVD to a thickness of, for example approximately 40Å on the first oxide layer 3.

Here, the thickness of the silicon nitride layer 4 is determined such that it can be entirely oxidized in a post-process described below, in which the silicon nitride layer 4 is oxidized except for the region thereof corresponding to the gate electrode described below.

Next, the silicon nitride layer 4 is subjected to thermal oxidation or CVD to form a second oxide layer 5 having a thickness of approximately 40Å.

Subsequently, a polycrystalline silicon layer 6 having a thickness of approximately 3000Å is formed by CVD on the second oxide layer 5.

Then, a pattern for forming a gate electrode, consisting of a resist layer 8, is formed on the polycrystalline silicon layer 6. This stage of the process is shown in FIG. 1.

Figure 2:
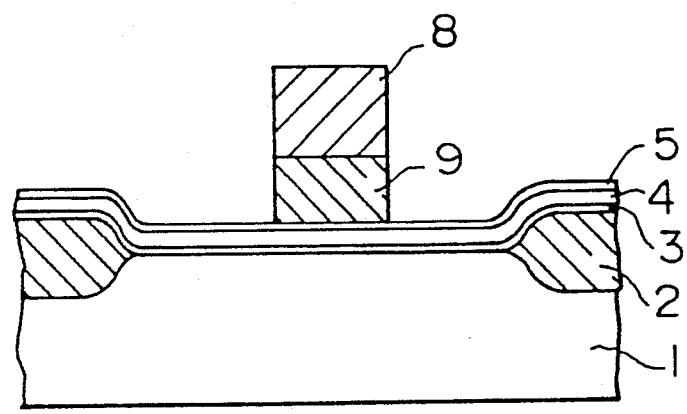
FIG. 2 is a schematic sectional view showing a part of the semiconductor device-producing process according to the first and second embodiments of this invention.

Next, using the resist layer pattern 8 obtained in the process shown in FIG. 1 as a mask, the polycrystalline silicon layer 6 is selectively etched to form a first gate electrode 9. The first gate electrode 9 is used as a memory gate electrode. This stage of the process is shown in FIG. 2.

Here, it is desirable to adopt an etching method in nich the etching selection ratio of the polycrystalline silicon layer 6 and the second oxide layer 5 can be 100 or more, for example, a reactive ion etching method using $Cl_2$, HCl and HBr. Even after the polycrystalline silicon layer 6 has been completely removed by this method, approximately 10Å or more of the second oxide layer 5 may remain.

Next, after removing the resist layer 8, the region around the gate electrode 9 and the region other than that are oxidized by steam at 900° C.

During this oxidation process, that region of the silicon nitride layer 4 other than the region around the first gate electrode 9 is oxidized in the following manner: since the silicon nitride layer 4, consisting of a non-oxidizable substance, has a thickness such that it may be entirely oxidized by this oxidation process, the silicon nitride layer 4 is oxidized through the second oxide layer 5 as expressed by the following formulae:

$$Si_3N_4 + 3O_2 \rightarrow 3SiO_2 + 2N_2 \qquad (1)$$

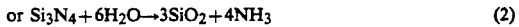

$$\text{or } Si_3N_4 + 6H_2O \rightarrow 3SiO_2 + 4NH_3 \qquad (2)$$

Figure 3:
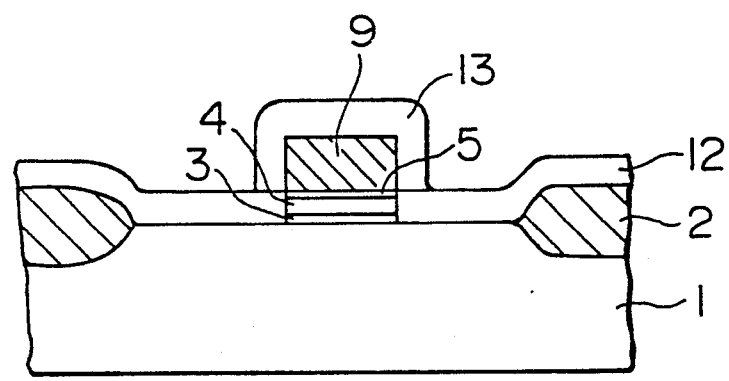
FIG. 3 is a schematic sectional view showing a part of the semiconductor device-producing process according to the first and second embodiments of this invention.

Therefore, as shown in FIG. 3, there is formed in the region other than that around the first gate electrode 9, a silicon oxide layer 12 which is composed of the first silicon oxide layer 3, the silicon oxide layer obtained by oxidizing the silicon nitride layer 4, and the second silicon oxide layer 5. The silicon oxide layer 12 is used as an address gate or as the gate insulating layer of an MOS transistor gate for a peripheral circuit. The silicon oxide layer 12 will be hereinafter referred to as "the gate insulating layer".

For example, the gate insulating layer 12 is formed in such a way that its total thickness is 150Å.

The thickness of the second oxide layer 5 is approximately 10Å, the oxide layer obtained by oxidizing the silicon nitride layer 4 is approximately 70Å, and the thickness of the first oxide layer 3 is approximately 20Å, so that the silicon substrate 1 has to be oxidized anew to a thickness of approximately 50Å before the total thickness of the gate insulating layer 12 can be made 150Å.

As described above, in the conventional process, the formation of the silicon oxide layer in that region of the surface of the silicon semiconductor substrate other than the region where the first gate electrode is formed, has been achieved as follows: first, the first silicon oxide layer, the oxidation-resistant layer and the second silicon oxide layer are removed so as to expose the silicon semiconductor substrate 1, and then a silicon oxide layer is formed anew thereon.

In the present invention, in contrast, the above step of exposing the semiconductor substrate can be eliminated, so that it is possible to avoid overetching the semiconductor substrate and overhang of the insulating layer under the first gate electrode.

In accordance with the present invention, a third silicon oxide layer 13 is formed around the first gate electrode 9 during this oxidation process. As will be described below, the third silicon oxide layer 13 is used as an inter-layer insulating film. The third silicon oxide layer 13 will be hereinafter referred to as "the inter-layer insulating film".

During this oxidation process, the silicon nitride layer 4 under the first gate electrode 9 is not oxidized. This stage of the process is shown in FIG. 3.

Next, a second gate electrode 14 is selectively formed by CVD on the inter-layer insulating film 13 and the gate insulating layer 12. The second gate electrode 14 is used as an address gate electrode.

Then, using the second gate electrode as a mask, ion implantation of impurities is performed on the semiconductor substrate 1 to form a source 15 and a drain 16.

Figure 4:
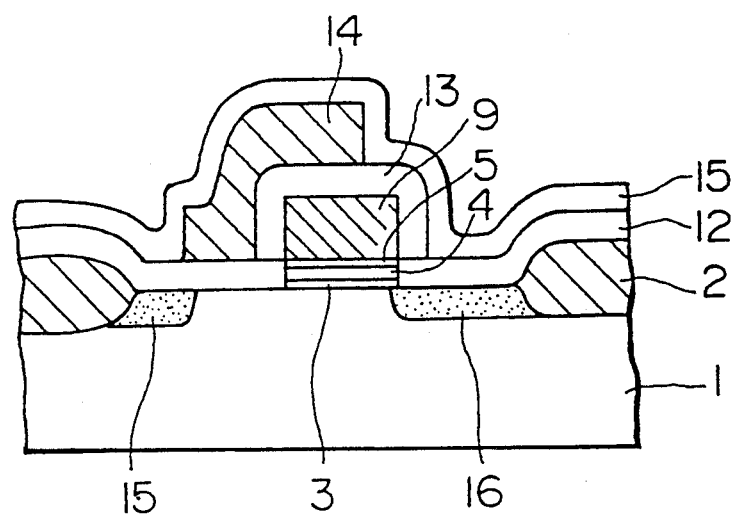
FIG. 4 is a schematic sectional view showing a part of the semiconductor device-producing process according to the first and second embodiments of this invention.

Subsequently, a fourth silicon oxide layer 15 is formed by CVD on the second gate electrode 14, the inter-layer insulating film 13, and the gate insulating layer 12 and is used as an insulating film. This stage of the process is shown in FIG. 4.

After that, further processes are performed as desired, thereby completing the semiconductor device.

Next, an embodiment of the present invention as claimed in claim 2 will be described.

Thermal oxidation is performed on the surface of a silicon semiconductor substrate 1 which has been separated into regions by a selectively formed silicon oxide layer 2, thereby forming a first oxide layer 3 having a thickness of approximately 20Å.

Then, for example, a silicon nitride layer 4, which is an oxidation-resistant layer, is formed on the first oxide layer 3 to a thickness of approximately 70Å by CVD.

Next, the surface of the silicon nitride layer 4 is oxidized by steam at 900° C. to form a second oxide layer 5 having a thickness of approximately 40Å.

As a result of this oxidation, the thickness of the silicon nitride layer 4 is reduced to approximately 40Å. Here, the thickness of the silicon nitride layer 4 is reduced to such a degree that the entire silicon can be oxidized in a post-process in which the silicon nitride layer 4 is oxidized except for the region which corresponds to the gate electrode.

Subsequently, a polycrystalline silicon layer 6 having a thickness of approximately 3000Å is formed on the second oxide layer 5, and a resist layer 8 is formed thereon.

This condition is the same as that of the first embodiment shown in FIG. 1. The subsequent procedures are the same as those of the first embodiment shown in FIGS. 2 through 4.

Next, an embodiment of this invention as claimed in claim 3 will be described.

First, a process which is the same as that of the claim 1 embodiment, shown in FIG. 1, is conducted to form the oxidation-resistant layer 4 to a thickness of approximately 70Å to 80Å.

Figure 5:
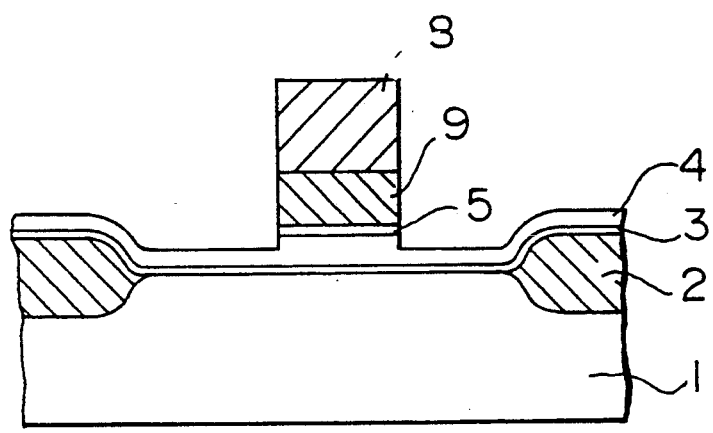
FIG. 5 is a schematic sectional view showing a part of a semiconductor device-producing process according to a third embodiment of this invention.

The procedure then advances to the step shown in FIG. 5.

In the step shown in FIG. 5, the polycrystalline silicon layer 6 is etched by using the resist layer 8 as a mask. Further, the etching is continued to remove the second oxide layer 5.

Subsequent to this, the silicon nitride layer 4 is etched to a thickness of, for example, approximately 40Å.

Here, the thickness of the silicon nitride layer 4 is reduced to such a degree that the entire silicon nitride layer 4 can be oxidized in a post-process in which the silicon nitride layer 4 is oxidized except for the region corresponding to the gate electrode.

Figure 6:
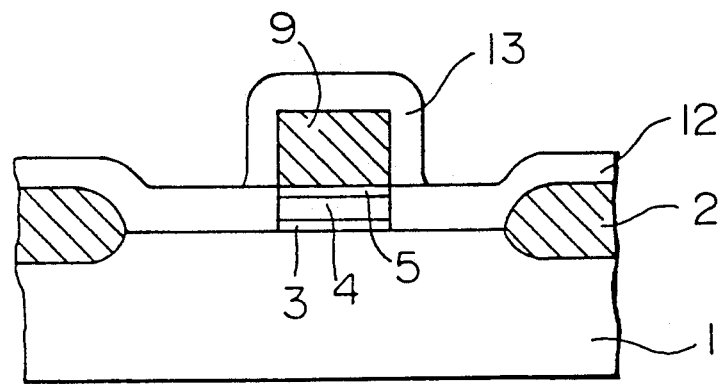
FIG. 6 is a schematic sectional view showing a part of the semiconductor device-producing process according to the third embodiment of this invention.

Next, the procedure advances to the step shown in FIG. 6. In the step shown in FIG. 6, that region of the silicon nitride layer 4 around the first gate electrode 9 and that region thereof other than that are oxidized by steam at 900° C.

Since the thickness of the silicon nitride layer 4 is such that the layer 4 can be entirely oxidized by this oxidation, that region of the silicon nitride layer 4 other than the region corresponding to the first gate electrode 9 is oxidized through the same chemical reaction as that in the first embodiment described above and is turned into a silicon oxide layer 12 having the same quality as the second oxide layer.

Further, a third oxide layer 13 is formed on the first gate electrode 9.

With the above steps, there is no need to perform etching until a part of the semiconductor substrate is exposed and, at the same time, the etching terminal control is facilitated. Thus, it is possible to eliminate the above-mentioned problems in the prior art, i.e., the overetching of the semiconductor substrate and overhang of the gate insulating layer.

Afterwards, the procedures which are the same as those in the first and second embodiments described above, shown in FIG. 4, are conducted. Then, further desired processes are performed, thereby completing the semiconductor device.

Although in the above first to third embodiments the non-oxidizable-substance layer 4 is changed by oxidation to a layer having the same quality as the second oxide layer, it is also possible to effect this change by some other chemical reaction, for example, by implantation of oxygen ions to effect annealing.

Figure 7:
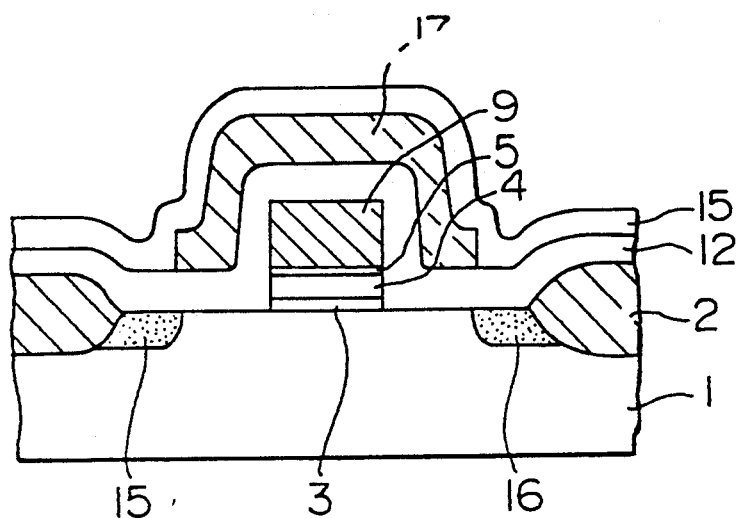
FIG. 7 is a schematic sectional view showing a part of a semiconductor device according to another embodiment of this invention.
Figure 8:
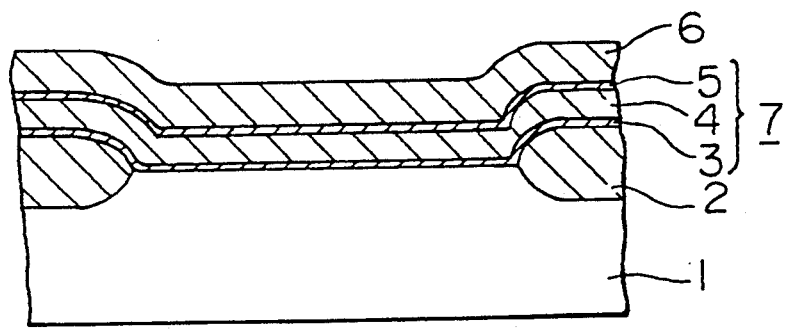
FIG. 8 is a schematic sectional view showing a part of a conventional semiconductor device-producing process.
Figure 9:
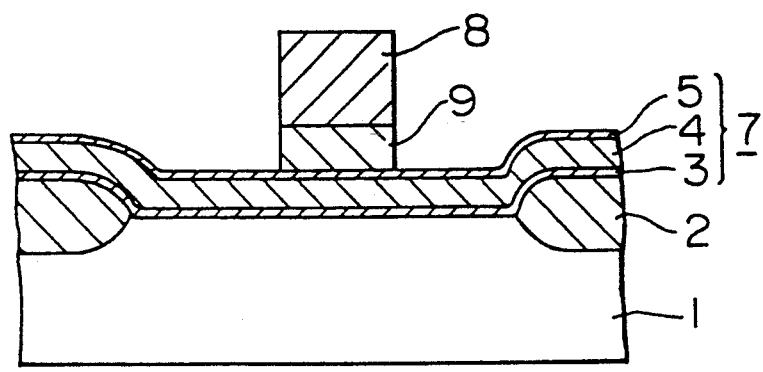
FIG. 9 is a schematic sectional view showing a part of the conventional semiconductor device-producing process.
Figure 10:
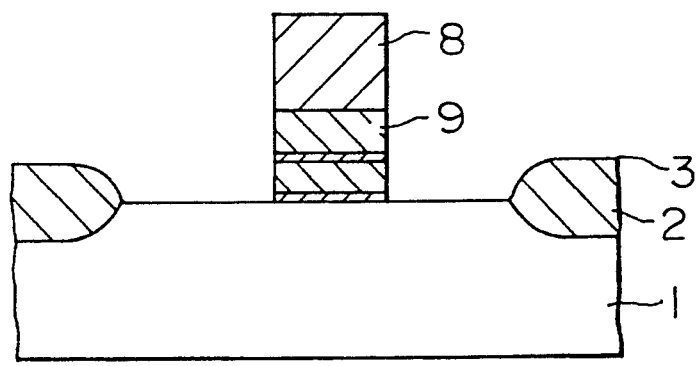
FIG. 10 is a schematic sectional view showing a part of the conventional semiconductor device-producing process.
Figure 11:
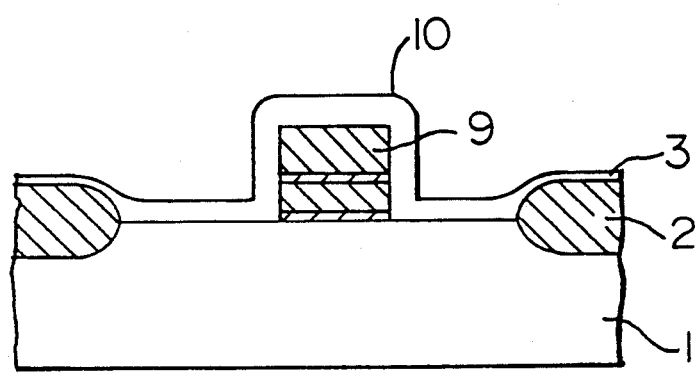
FIG. 11 is a schematic sectional view showing a part of the conventional semiconductor device-producing process.
Figure 12:
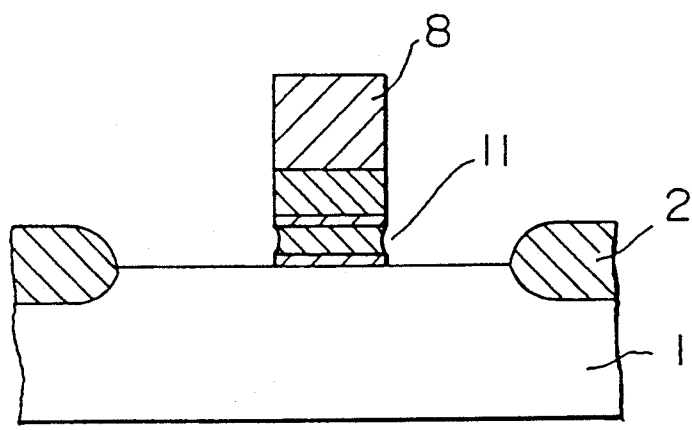
FIG. 12 is a diagram illustrating a problem in the conventional semiconductor device-producing process.

The semiconductor device production method of this invention is not limited to the production of a semiconductor device having the structure described with reference to the above embodiments. The method is also applicable to the production of a semiconductor device including a second gate electrode 17 having a structure as shown in FIG. 7. The method is also applicable to the production of a semiconductor device having no second gate electrode.

As described above, in accordance with this invention, it is possible to eliminate the step of performing etching until a part of the semiconductor substrate is exposed, so that overetching the semiconductor substrate and overhang of the gate insulating layer can be avoided. Further, the production processes can be simplified. Thus, the present invention makes it possible to produce a semiconductor device having excellent memory characteristics and high reliability.

What is claimed is:

1. A method of producing a semiconductor device of the type which includes a semiconductor substrate; a gate insulating layer of a triplex structure formed on said semiconductor substrate and composed of a first oxide layer, an oxidation-resistant layer and a second oxide layer; and a gate electrode formed on said gate insulating layer, said method comprising the steps of:

forming the first oxide layer, the oxidation-resistant layer, and the second oxide layer successively on said semiconductor substrate;

adjusting the thickness of said oxidation-resistant layer during or after the formation thereof in such a way that the entire oxidation-resistant layer can be oxidized in an after-process in which said oxidation-resistant layer is to be oxidized except for that region thereof which corresponds to said gate electrode; and oxidizing said oxidation-resistant layer except for the region thereof corresponding to said gate electrode and forming an oxide layer around said gate electrode.

2. A method of producing a semiconductor device of the type which includes a semiconductor substrate; a gate insulating layer of a triplex structure formed on said semiconductor substrate and composed of a first oxide layer, an oxidation-resistant layer and a second oxide layer; and a gate electrode formed on said gate insulating layer, said method comprising:

a first step of forming the first oxide layer on said semiconductor substrate, forming the oxidation-resistant layer on said first oxide layer to a thickness such that said oxidation-resistant layer is to be entirely oxidized by oxidation in a post-process (third step), and forming the second oxide layer on this oxidation-resistant layer;

a second step of forming the gate electrode on the second oxide layer; and a third step of oxidizing said oxidation-resistant layer through the second oxide layer except for the region which corresponds to said gate electrode, and forming an oxide layer around said gate electrode.

3. A method of producing a semiconductor device of the type which includes a semiconductor substrate; a gate insulating layer of a triplex structure formed on said semiconductor substrate and composed of a first oxide layer, an oxidation-resistant layer and a second oxide layer; and a gate electrode formed on said gate insulating layer, said method comprising:

a first step of forming the first oxide layer on said semiconductor substrate, forming the oxidation-resistant layer on said first oxide layer, and oxidizing an upper portion of said oxidation-resistant layer to form the second oxide layer in such a way that the thickness of that portion of said oxidation-resistant layer which remains without being oxidize after the formation of said second oxide layer is such that the oxidation-resistant layer is to be entirely oxidized by oxidation in a post-process (third step).

a second step of forming the gate electrode on said second oxide layer; and a third step of oxidizing said oxidation-resistant layer through the second oxide layer except for the region which corresponds to said gate electrode, and forming an oxide layer around said gate electrode.

4. A method of producing a semiconductor device of the type which includes a semiconductor substrate; a gate insulating layer of a triplex structure formed on said semiconductor substrate and composed of a first oxide layer, an oxidation-resistant layer and a second oxide layer; and a gate electrode formed on said gate insulating layer, said method comprising:

a first step of forming the first oxide layer, the oxidation-resistant layer, and the second oxide layer successively on said semiconductor substrate, a second step of forming the gate electrode on said second oxide layer; and a third step of removing the second oxide layer except for the region where said gate electrode is formed, etching the thereby exposed portion of said oxidation-resistant layer to a thickness such that this oxidation-resistant layer is to be entirely oxidized by oxidation in a post-process (fourth step); and a fourth step of oxidizing the etched oxidation-resistant layer except for the region corresponding to said gate electrode and forming an oxide layer around said gate electrode.

* * * * *